United States Patent [19]

Yao et al.

[11] Patent Number: 4,937,639
[45] Date of Patent: Jun. 26, 1990

[54] INPUT PROTECTOR DEVICE FOR SEMICONDUCTOR DEVICE

[75] Inventors: Kenji Yao, Yokohama; Teruyoshi Mihara, Yokosuka; Noriyuki Abe; Tsutomu Matsushita, both of Yokohama, all of Japan

[73] Assignee: Nissan Motor Company, Limited, Yokohama, Japan

[21] Appl. No.: 257,577

[22] Filed: Oct. 14, 1988

[30] Foreign Application Priority Data

Oct. 16, 1987 [JP] Japan .................................. 62-259595

[51] Int. Cl.$^5$ .............................................. H01L 27/00
[52] U.S. Cl. .................................. 357/23.13; 357/50; 357/51; 357/59; 357/20
[58] Field of Search ................... 357/23.13, 50, 51, 59, 357/20

[56] References Cited

U.S. PATENT DOCUMENTS 4,288,829 9/1981 Tango ..................................... 361/56
4,777,518 10/1988 Mihara ............................. 357/23.13

FOREIGN PATENT DOCUMENTS

54-101283 8/1979 Japan .
55-91173 7/1980 Japan .............................. 357/23.13
59-91173 7/1980 Japan .
58-73160 5/1983 Japan .
59-111356 6/1984 Japan .

Primary Examiner—Andrew J. James
Assistant Examiner—David Soltz
Attorney, Agent, or Firm—Foley & Lardner, Schwartz, Jeffery, Schwaab, Mack, Blumenthal & Evans

[57] ABSTRACT

An input protector device for a semiconductor device such as a CMOS device, in which a first resistor is formed on an insulating film of a semiconductor substrate, and a second resistor is formed of an impurity diffusion region in the substrate, the first and second resistors and a capacitor being coupled to one another in series to constitute a filter circuit, and in which first and second diodes each cooperated with at least one of the first and second resistors, by-passing noises having low and high voltages, respectively, and a high frequency noise is cut by the filter circuit, thereby effectively preventing latchup.

11 Claims, 8 Drawing Sheets

INPUT PROTECTOR DEVICE FOR SEMICONDUCTOR DEVICE

BACKGROUND OF THE INVENTION

1. Field of the Invention

The present invention relates to an input protector device for a semiconductor device such as a CMOS device or the like.

2. Description of the Prior Art

Figure 1:
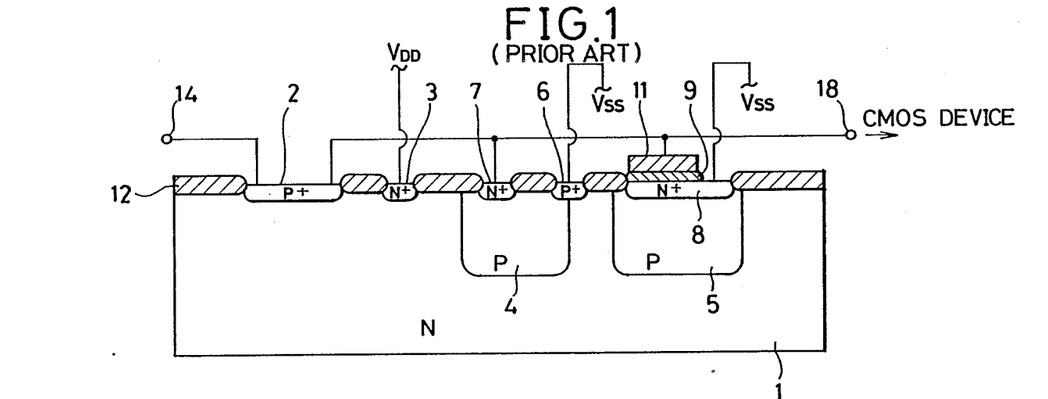
FIG. 1 is a longitudinal cross sectional view of a first embodiment of a conventional input protector device for a semiconductor device.
Figure 2:
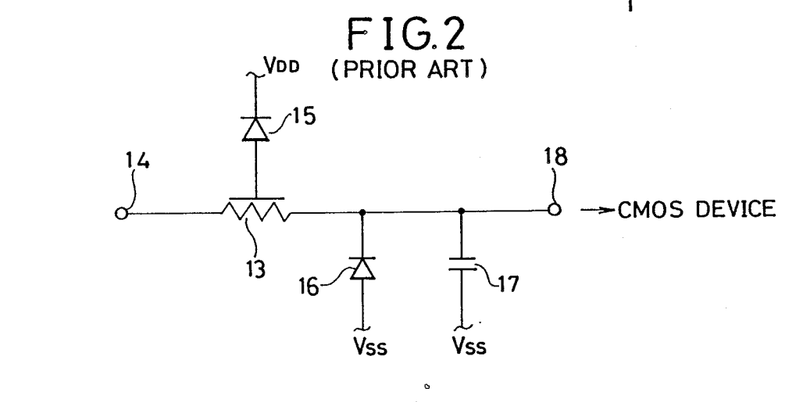
FIG. 2 is a circuit diagram of FIG. 1.

In FIGS. 1 and 2, there is shown a conventional input protector device for a semiconductor device, for example, an n-channel complementary metal oxide semiconductor (CMOS) device having a P-type well region formed in the surface area of an N-type semiconductor substrate. As shown in FIG. 1, in an N-type semiconductor substrate 1, a P+-type diffusion region 2, an N+-type contact region 3 and two P-type well regions 4 and 5 are separately formed in its main surface area. A P+-type well contact region 6 and an N+-type region 7 are formed, respectively, in the right side border portion and the left side portion of the surface area of the P-type well region 4, and an N+-type diffusion region 8 is formed in the surface area of the P-type well region 5. A polycrystalline silicon film 11 is formed as an electrode on the N+-type diffusion region 8 via an insulating film 9. A silicon oxide insulating film 12 is formed over the main surface of the N-type semiconductor substrate 1.

In this embodiment, the P+-type diffusion region 2 acts as a resistor 13, of which the left side end portion is coupled to an input terminal 14 and the right side end portion is connected to an output terminal 18 to be connected to a semiconductor device such as a CMOS device to be protected. The resistor 13 is designed to possess a resistance of approximately several hundreds of kiloohms and is cooperated with a capacitor 17 to constitute a filter circuit for a high frequency wave noise, as hereinafter described in detail. The PN junction of the P+-type diffusion region 2 and the N-type substrate 1 constitutes a first diode 15, and its cathode is coupled to a power source $V_{DD}$ through the N+-type contact region 3. The PN junction of the P-type well region 4 and the N+-type region 7 constitutes a second diode 16, of which the cathode is connected to the right side end of the resistor 13 and the output terminal 18, and the anode is linked to a low voltage source $V_{SS}$ such as the ground or the like. The N+-type diffusion region 8, the insulating film 9 and the polycrystalline silicon electrode 11 constitute the capacitor 17 by virtue of the electrostatic induction of its MOS structure. One end 8 of the capacitor 17 is connected to the low volyage source $V_{SS}$, and the other end 11 of the same is connected to the right side end of the resistor 13. The capacitor 17 and the resistor 13 constitute a filter circuit, and its output terminal 18 is connected to the CMOS device (not shown) which is formed in another portion of the N-type substrate 1.

On a normal operation, a signal fed to the input terminal 14 is supplied to the CMOS through the resistor 13, while the first and second diodes 15 and 16 are reversely biased to be electrically separated from each other.

When a noise having a higher voltage than that of the power source $V_{DD}$ is given to the input terminal 14, the first diode 15 is foward-biased, and the noise is bypassed to the power source $V_{DD}$ through the N-type substrate 1. In turn, when a noise having a lower voltage than that of the low voltage source $V_{SS}$ is supplied to the input terminal 14, the second diode 16 is foward-biased to by-pass the noise to the low voltage source $V_{SS}$ via the P-type well region 4.

When a signal carrying a high frequency noise is fed to the input terminal 14, the filter circuit composed of the resistor 13 and the capacitor 17 is actuated to remove a noise having a shorter period than the time constant determined by the product of the resistor 13 and the capacitor 17, thereby preventing a malfunction. The high frequency noise which malfunctions the CMOS device usually possesses a frequency of approximately several MHz to several GHz, and the capacitance of the MOS capacitor actually admissible in the MOS device is several 10 pF. Accordingly, the resistance of the resistor 13 which is composed the filter circuit together with the capacitor 17 is determined to approximately several 100 kiloohms.

However, in the above described conventional device, since the resistor 13 having a relatively large resistance of several 100 kiloohms is formed by the P+-type diffusion region 2, the length of the resistor pattern becomes long, and its chip area inevitably becomes large, which brings about the cost increase.

Figure 3:
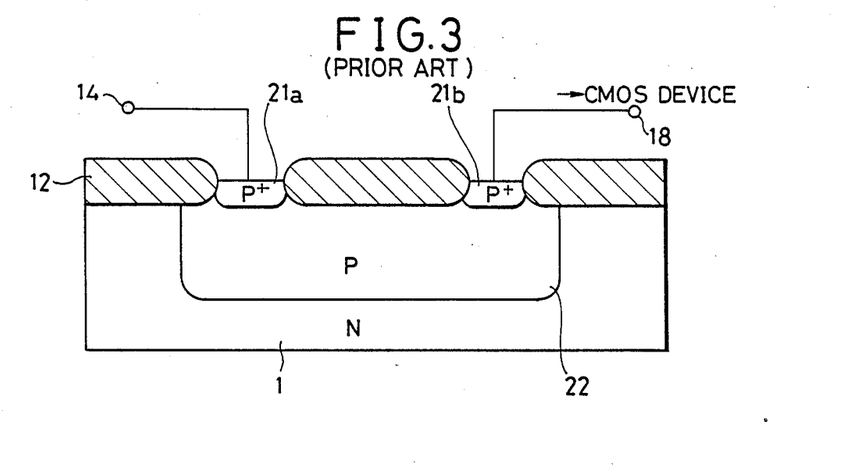
FIG. 3 is a longitudinal cross sectional view of a second embodiment of the conventional input protector device.

Then, in order to remove the problem of the first conventional device, another conventional input protector device has been developed, in which a resistor is formed using a high resistance diffusion area such as P-type well region, as shown in FIG. 3. In the drawing, a P-type well region 22 is formed in the surface area of the N-type substrate 1, and a pair of P+-type well contact regions 21a and 21b are formed in the left and right side end portions of the surface area of the P-type well region 22. In this embodiment, the resistor 13 is formed by the high resistance diffusion area of the P-type well region 22, and the PN junction of the P-type well region 22 and the N-type substrate 1 constitutes the first diode 15.

In this case, the resistance of the P-type well region 22 increases approximately 1000 times as high as that of the P+-type diffusion region 2 in FIG. 1, and therefore, when the resistor having the resistance of several 100 kiloohms is formed in the P-type well region, the pattern area and thus its chip area can be largely reduced in comparison with those formed in the P+-type diffusion region, with the result of saving the manufacturing cost.

However, in the first and second conventional devices, the following problem arises. That is, as described above, when the noise having the higher voltage than that of the power source $V_{DD}$ is fed to the input terminal 14, the first diode 15 composed of the PN junction of the P+-type diffusion region 2 or the P-type well region 22 and the N-type substrate 1 is foward-biased, the noise is by-passed to the power source $V_{DD}$ via the N-type substrate 1. On this occasion, a large number of holes (the minority carrier) are injected from the P+-type diffusion region 2 or the P-type well region 22 into the N-type substrate 1. The injected holes spread in the N-type substrate 1 to reach another P-type well region and may bring about a voltage change of the P-type well region, that is, may turn on a parasitic bipolar transistor or a parasitic thyristor, i.e., act as a trigger on a undesirable latchup phenomenon.

In order to avoid the latchup phenomenon, it is necessary to control the actuation of the parasitic bipolar transistor or the parasitic thyristor by, for instance, providing the P+-type diffusion region 2 or the P-type well region 22 in the position sufficiently apart from the semiconductor device such as the CMOS or the like. However, in such a case, the chip area further increases in the first conventional device, and it is difficult to reduce the chip area even when the resistor 13 is formed using the high resistance diffusion area of the P-type well region 22 in the second conventional device.

Figure 4:
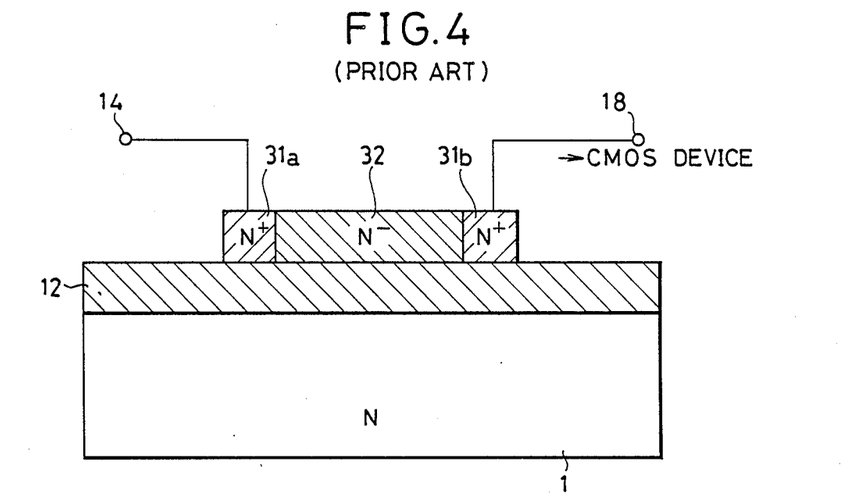
FIG. 4 is a longitudinal cross sectional view of a third embodiment of the conventional input protector device.

Furthermore, in order to remove the above problem, a still another conventional input protector device has been proposed, as shown in FIG. 4, in which an N⁻-type polycrystalline silicon layer 32 having a high resistance is formed as the resistor 13 on a silicon oxide film 12 of the N-type semiconductor substrate 1, and the polycrystalline silicon 32 is provided with a pair of contact regions 31a and 31b of N⁺-type polycrystalline silicon in the left and right side ends. In this embodiment, the first diode is independently formed in the N-type substrate 1 and is to be connected to the resistor 13 of the polycrystalline silicon 32.

In this case, the injection of the holes from the resistor 13 into the N-type substrate 1 can be prevented, and the resistor 13 having several 100 kiloohms can be formed using the polycrystalline silicon 32 of the high resistance, with a small pattern area thereof. When the noise having the higher voltage than that of the power source $V_{DD}$ is supplied to the input terminal 14, the holes are injected from the first diode positioned in the followed stage of the resistor 13 to the N-type substrate 1. However, in this embodiment, the current is restricted by the resistor 13 of the polycrystalline silicon 32, and hence the amount of the injected holes is so limited to the low level that the latchup may not be caused.

However, in the third conventional device, a doping step of an impurity such as ions into the polycrystalline silicon for controlling the resistance of the resistor 13 is required, which brings about the cost increase due to the increase of the number of the steps. Further, as compared with the second conventional device including the resistor 13 formed using the P-type well region of the high resistance diffusion area, the dispersion of the resistance values of the resistor 13 becomes large and it is difficult to control the accuracy of the resistance value.

SUMMARY OF THE INVENTION

Accordingly, it is an object of the present invention to provide an input protector device for a semiconductor device, free from the aforementioned defects and disadvantages of the prior art, which is capable of preventing an undesirable parasitic interaction such as latchup, accurately controlling a resistance of a resistor therein, and reducing its chip size to reduce a manufacturing cost.

In accordance with one aspect of the invention, there is provided an input protector device for a semiconductor device, comprising a semiconductor substrate of a first conductivity type, having an insulating film on its surface, a first resistor formed on the insulating film, a second resistor of an impurity diffusion region formed in the substrate, the first and second resistors being coupled in series, a capacitor formed in a surface area of the substrate, the capacitor being further connected in series to the first and second resistors, a first diode cooperated with at least one of the first and second resistors, for by-passing a noise having a low voltage, and a second diode cooperated with at least one of the first and second resistors, for by-passing a noise having a high voltage.

DESCRIPTION OF THE PREFERRED EMBODIMENTS

Figure 5:
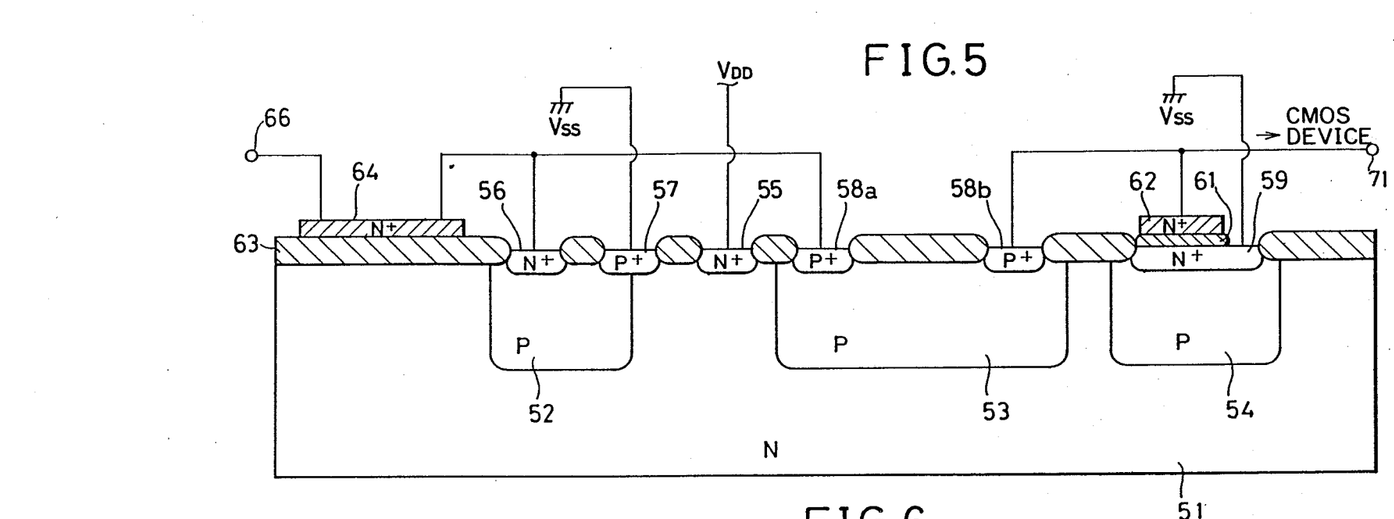
FIG. 5 is a longitudinal cross sectional view of a first embodiment of an input protector device for a semiconductor device according to the present invention.
Figure 6:
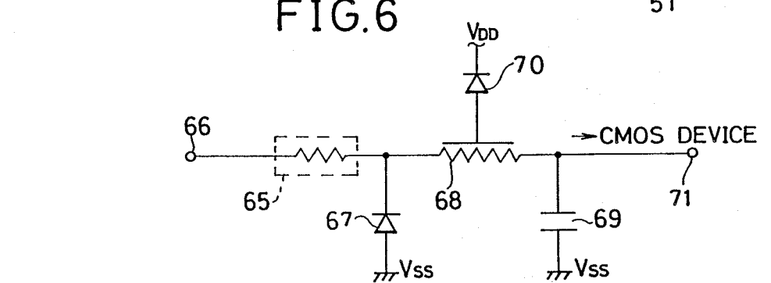
FIG. 6 is a circuit diagram of FIG. 5.

Referring now to the drawings, wherein like reference characters designate like or corresponding parts throughout the several views, there is shown in FIGS. 5 and 6 the first embodiment of an input protector device for a semiconductor device such as a CMOS device or the like.

In the drawings, in an N-type semiconductor substrate 51, first, second and third P-type well regions 52, 53 and 54 and an N⁺-type contact region 55 positioned between the regions 52 and 53 are formed in the main surface area. In the P-type well region 52 for providing a first diode 67 hereinafter described in detail, an N⁺-type region 56 and a P⁺-type well contact region 57 are formed respectively in the left side portion and the right side border portion of the surface area, and the P⁺-type well contact region 57 is coupled to a low voltage source $V_{SS}$ such as the ground or the like.

In the P-type well region 53 of an impurity diffusion area for forming a second resistor 68 using its high resistance diffusion area, as hereinafter described in detail, a pair of P⁺-type well contact regions 58a and 58b are provided in the surface area. In the P-type well region 54, an N⁺-type diffusion region 59 is formed in the surface area, and a polycrystalline silicon film 62 is formed as an electrode on the N⁺-type diffusion region 59 via an insulating film 61. The N⁺-type diffusion region 59, the insulating film 61 and the polycrystalline silicon film 62 constitute a MOS capacitor 69. The P⁺-type well contact region 58b of the second resistor 68 and the polycrystalline silicon oxide film 62 of the capacitor 69 lead to an output terminal 71 which is connected to the semiconductor device such as the CMOS device to be protected.

A silicon oxide insulating film 63 is formed over the main surface of the N-type semiconductor substrate 51, and a polycrystalline silicon film 64 for constituting a first resistor 65 is provided on the silicon oxide film 63. One end of the first resistor 65 is coupled to an input terminal 66 and the other end of the first resistor 65 is connected to the N+-type region 56 of the first diode 67 and to the P+-type well contact region 58a of the second resistor 68. A series of the first resistor 65 of the polycrystalline silicon film 64 and the second resistor 68 of the second P-type well region 53 corresponds to the resistor 13 of the first conventional device shown in FIG. 2.

The high resistance of about 100 kiloohms can be realized by a relatively small pattern area in the second P-type well region 53 of the high resistance diffusion area, and thus the resistance of the first resistor 65 composed of the polycrystalline silicon 64 is designed to several kiloohms to several 10 kiloohms at the most. In order to obtain such a not high resistance of the resistor 65, it is not necessary to use the polycrystalline silicon having the high resistance, and it can be sufficiently prepared by using the N+-type polycrystalline silicon having the low resistance for electric wiring without requiring a large pattern area. Further, the impurity doping step for adjusting the high resistance value of the resistor can not be required.

As shown in FIG. 6, the input terminal 66 is connected to one end of the first resistor 65 formed by the polycrystalline silicon 64, and the other end of the first resistor 65 is linked to the cathode of the first diode 67 composed of the PN junction of the first P-type well region 52 and the N+-type region 56. The anode of the first diode 67 is connected to the low voltage source V$_{SS}$ through the P+-type well contact region 57.

The other end of the first resistor 65 and the cathode of the first diode 67 are connected to one end of the second resistor 68 formed by the second P-type well region 53 of the high resistance diffusion area, and the other end of the second resistor 68 is connected to the polycrystalline silicon electrode 62 of the capacitor 69 and to the output terminal 71. The N+-type diffusion region 59 of the capacitor 69 is coupled to the low voltage source V$_{SS}$. The N+-type diffusion region 59 may be connected to a power source V$_{DD}$.

The PN junction of the second P-type well region 53 and the N-type substrate 51 constitutes a second diode 70, and its cathode is connected to the power source V$_{DD}$ through the N+-type contact region 55. The first resistor 65, the second resistor 68 and the capacitor 69 constitute a filter circuit, and the output terminal 71 is to be connected to the CMOS device (not shown) which is formed in another portion of the N-type substrate 51.

When the resistances of the first and second resistors 65 and 68 and the capacitance of the capacitor 69 are defined as r (ohm), R (ohm) and C (F), respectively, the time constant $\tau$ (S) is represented by the following formula:

$$\tau = (r + R) \cdot C \tag{1}$$

As described above, since the high frequency noise which malfunctions or erroneously drives the semiconductor device such as the CMOS device, has a frequency of approximately several MHz to several GHz, the time constant $\tau$ of the filter circuit is determined to several $\mu$S so as to cut the high frequency noise. Further, since the capacitance of the MOS capacitor actually admissible in the semiconductor device such as the CMOS device is several 10 pF, the resistance R of the second resistor 68 is determined to approximately 100 kiloohms by the high resistance diffusion area of the second P-type well region 53, and the resistance r of the first resistor 65 is determined to approximately several kiloohms by the N+-type polycrystalline silicon 64.

In this embodiment, as described above, the relatively high resistance R of about 100 kiloohms of the second resistor 68 is formed in the relatively small pattern area by the high resistance diffusion area of the second P-type well region 53, and the relatively low resistance r of about several kiloohms of the first resistor 65 is provided in the relatively small pattern area by the N+-type polycrystalline silicon 64. In this case, the dispersion of the resistance values of the resistors can be reduced at least several percent in comparison with the conventional resistor composed of the polycrystalline silicon, as shown in FIG. 4, and hence the time constant $\tau$ can be well controlled with a good reproducibility.

Then, the operation of the above-described input protector device for the semiconductor device such as the CMOS device according to the present invention will be described.

In the normal operation, the signal fed to the input terminal 66 is supplied to the semiconductor device such as the CMOS device to be protected through the first and second resistors 65 and 68 and the output terminal 71 while both the first and second diodes 67 and 70 are reverse-biased to be electrically separated from each other.

When the noise having a higher voltage than that of the power source V$_{DD}$ is fed to the input terminal 66, the second diode 70 is foward-biased, and the noise current is by-passed to the power source V$_{DD}$ via the first resistor 65, the second resistor 68 and the N-type substrate 51. On this occasion, the holes are injected from the second P-type well region 53 into the N-type substrate 51. However, the current flowing in the second diode 70, i.e., the current flowing into the N-type substrate 51 is restricted to below a certain value by the first resistor 65 to control the amount of the holes injected into the N-type substrate 51 to the low level, resulting in that the injection of the holes into the N-type substrate 51 becomes the trigger on the latchup.

In general, the trigger current for causing the latchup in a usual CMOS device is approximately several 10 mA to several 100 mA, supposing that the maximum voltage of the noise to be input into the input terminal 66 is 100 V, since the first resistor 65 is determined to approximately several kiloohms to several 10 kiloohms as described above, the noise current is limited to below the trigger current for causing the latchup, i.e., the latchup can be effectively prevented.

When the noise having the lower voltage than that of the low voltage source V$_{SS}$ is supplied to the input terminal 66, the first diode 67 is foward-biased, and the noise current is by-passed to the low voltage source V$_{SS}$ through the first resistor 65 and the first P-type well region 52. At this time, the current flowing the first diode 67 is restricted to below the predetermined value by the first resistor 65 to control the amount of the electrons injected into the first P-type well region 52 to the low level, and thereby the latchup can be prevented.

Further, when the signal carrying the high frequency noise having the frequency of approximately several MHz to several GHz due to a radio wave hindrance or the like is fed to the input terminal 66, the filter circuit constituted by the first resistor 65, the second resistor 68 and the capacitor 69 is actuated to cut off the noise, thereby passing the signal only to the semiconductor device.

In this embodiment, since the main part of the second resistor 68 in the filter circuit is composed of the second P-type well region 53 of the high resistance diffusion area which is precisely prepared, the time constant $\tau$ of the filter circuit can be properly restricted to the desired value with the good reproducibility, and accordingly the high frequency noise can be effectively and exactly cut.

Figure 7:
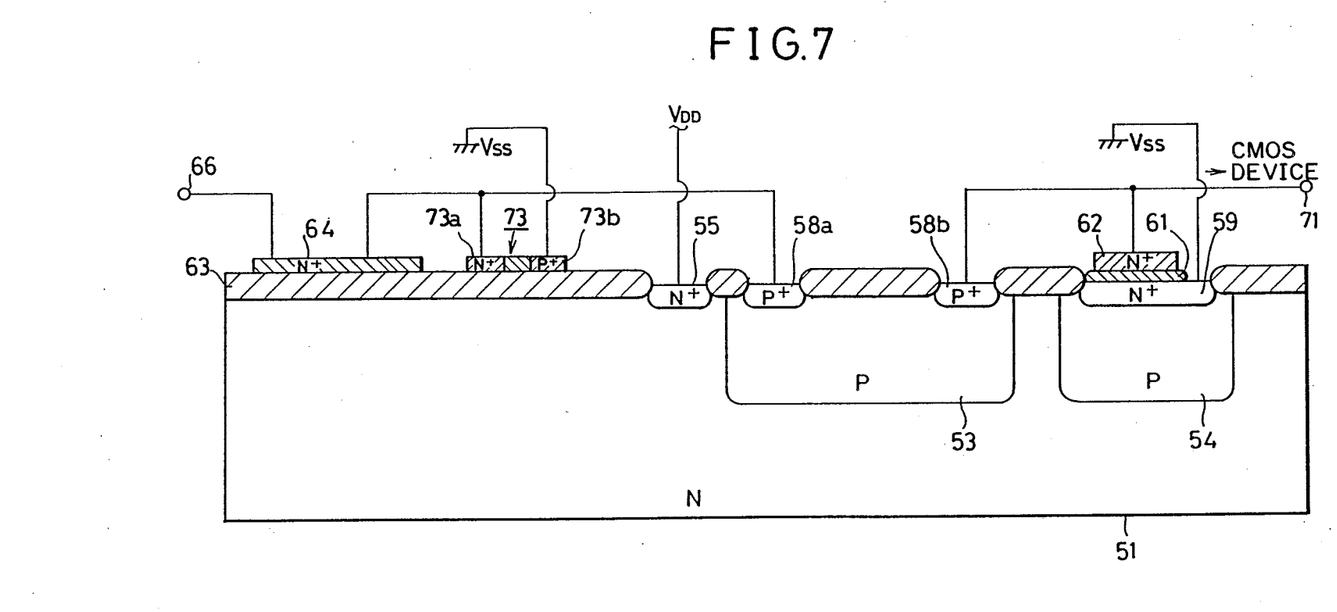
FIG. 7 is a longitudinal cross sectional view of a second embodiment of the input protector device according to the present invention.
Figure 8:
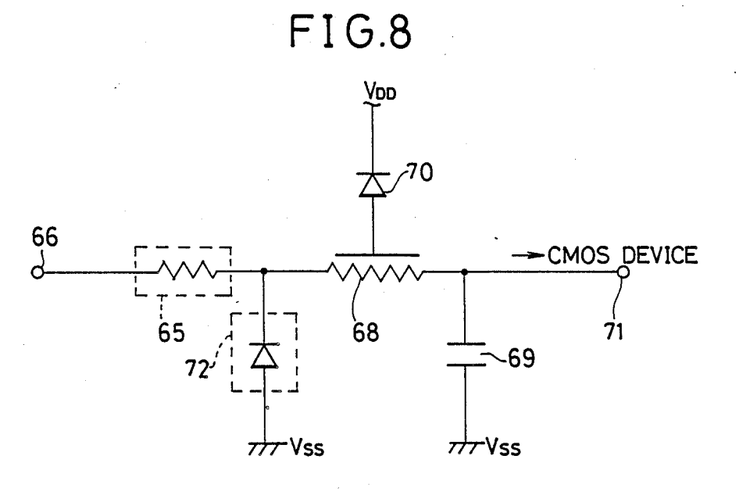
FIG. 8 is a circuit diagram of FIG. 7.

In FIGS. 7 and 8, there is shown the second embodiment of the input protector device for the semiconductor device according to the present invention.

In this embodiment, the input protector device has the same construction as that of the first embodiment shown in FIGS. 5 and 6, except that a first diode 72 of FIG. 8 comprises a polycrystalline silicon diode 73 formed on the silicon oxide film 63, which includes a P+-type polycrystalline silicon region 73a and an N+-type polycrystalline silicon region 73b in the left and right side ends. The P+-type polycrystalline silicon region 73a and the N+-type polycrystalline silicon region 73b are connected to the one end of the N+-type polycrystalline silicon 64 and the low voltage source $V_{SS}$, respectively.

In this embodiment, when the noise having the lower voltage than that of the low voltage source $V_{SS}$ is supplied to the input terminal 66, as compared with the first embodiment in which the electrons are injected into the first P-type well region, no electron is injected and the latchup can be more effectively prevented.

Figure 9:
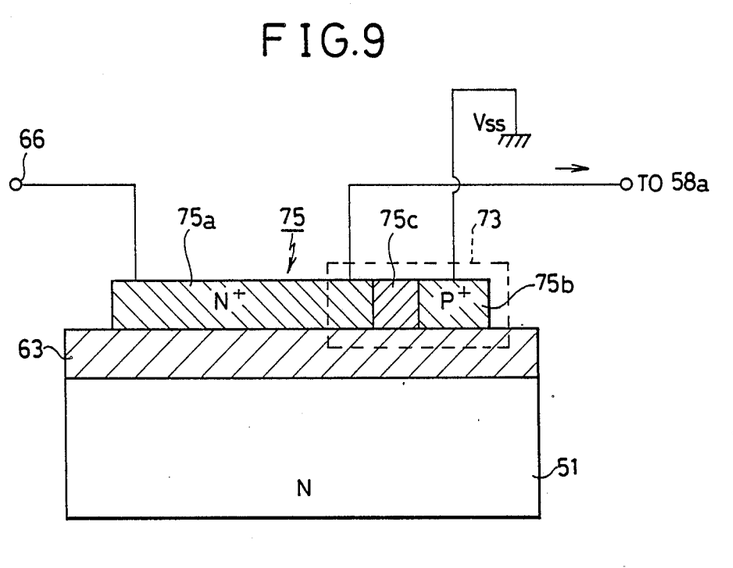
FIG. 9 is a combined modification of a polycrystalline silicon resistor and a polycrystalline silicon diode shown in FIG. 7.

In FIG. 9, there is shown one modification of a combination of the first resistor 65 and the first diode 72 of the second embodiment shown in FIGS. 7 and 8, that is, the N+-type polycrystalline silicon 64 of the first resistor 65 is integrally combined with the polycrystalline silicon diode 73 of the first diode 72. In a polycrystalline silicon 75, the N+-type polycrystalline silicon region 75 constitutes the first resistor 65, and the right side end portion of the N+-type, a P+-type polycrystalline silicon region 75b and a non-doped polycrystalline silicon region 75c therebetween constitute the first diode 72 composed of the polycrystalline silicon diode 73.

In this embodiment, it is necessary that the resistant pressure of the N+-P+ junction of the first diode 73 in the reverse direction is designed to be more than the voltage of the power source $V_{DD}$, and thus the non-doped polycrystalline silicon region 75c is inserted between the N+-type polycrystalline silicon region 75a and the P+-type polycrystalline silicon region 75b so as not to directly contact to each other by altering the ion-doping patterns. In this case, the electrical wiring between the first resistor 65 and the first diode 73 can be omitted, and hence the chip size can be largely diminished.

Figure 10:
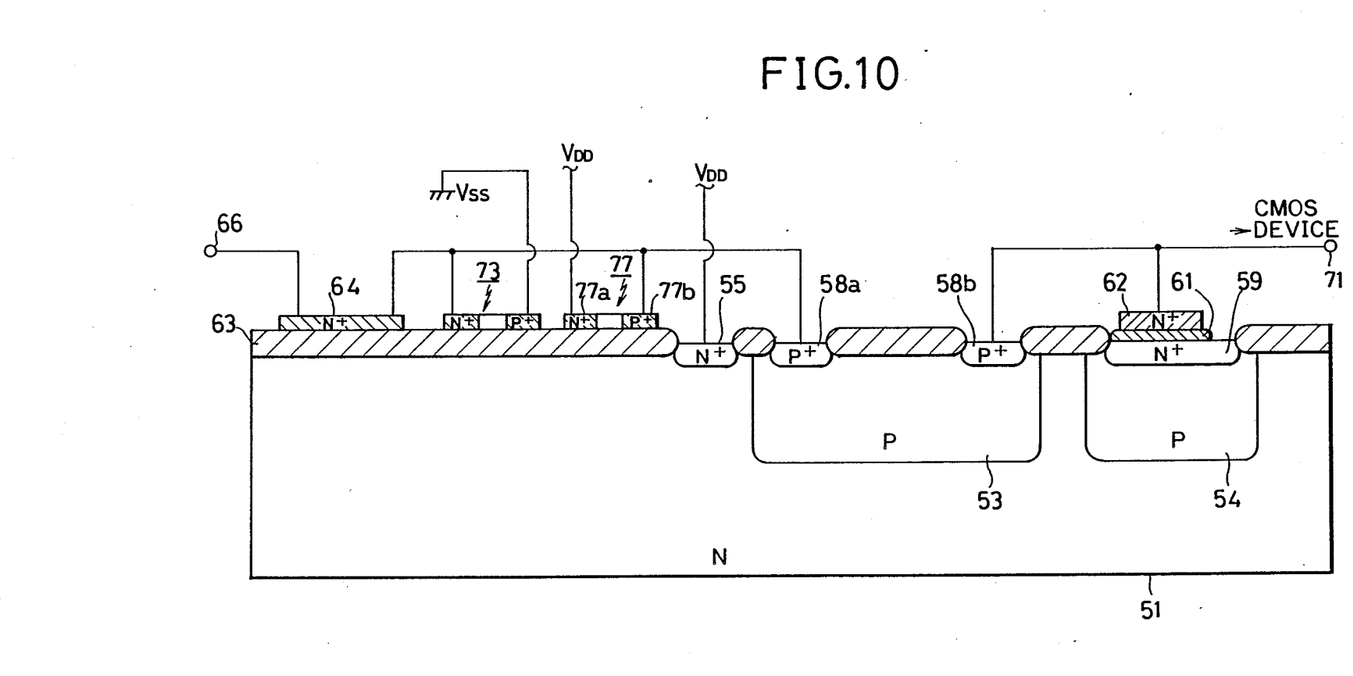
FIG. 10 is a longitudinal cross sectional view of a third embodiment of the input protector device according to the present invention.
Figure 11:
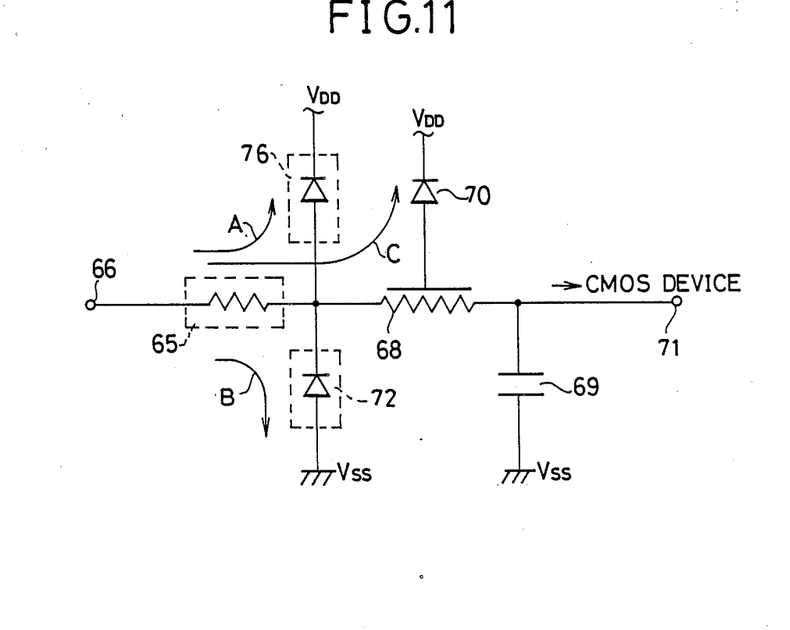
FIG. 11 is a circuit diagram of FIG. 10.

There is shown in FIGS. 10 and 11 the fourth embodiment of the input protector device for the semiconductor device according to the present invention. In this embodiment, the structure of the input protector device is similar to that of the second embodiment shown in FIGS. 8 and 9, and a third diode 76 is arranged on the silicon oxide film 63 in parallel with the second diode 70 with respect to the power source $V_{DD}$, and is comprised of a polycrystalline silicon diode 77 including an N+-type polycrystalline silicon region 77a and a P+-type polycrystalline silicon region 77b in its left and right side ends. The N+-type polycrystalline silicon region 77a and the P+-type polycrystalline silicon region 77b are linked to the power source $V_{DD}$ and one end of the first resistor 65, respectively.

Although, when the noise having the higher voltage than that of the power source $V_{DD}$ is fed to the input terminal 66 in the first and second embodiments, the noise current is entirely by-passed to the power source $V_{DD}$ via the second diode 70, i.e., the second P-type well region 53 and the N-type substrate 51, as indicated by an arrow C in FIG. 11, however, in the third embodiment, since the third diode 76 is provided in parallel with the second diode 70, the noise current is by-passed to the power source $V_{DD}$ through the two diodes 76 and 70, as indicated by the two arrows A and C in FIG. 11.

When the noise current is by-passed to the power source $V_{DD}$ through the second diode 70 in the path indicated by the arrow C, the holes are injected from the second P-type well region 53 into the N-type substrate 51. However, when the junction area of the third diode 76, i.e., the polycrystalline silicon diode 77 is widened to a certain extent, most of the noise current may be by-passed to the power source $V_{DD}$ through the third diode 76, as indicated by the arrow A in FIG. 11, and therefore the noise current passing through the second diode 70, as indicated by the arrow C, may be reduced to a small amount. Accordingly, in this embodiment, when the noise having the higher voltage than that of the power source $V_{DD}$ is given to the input terminal 66, the injection of the holes into the N-type substrate 51 may be almost completely prevented, and hence the latchup can be more effectively prevented.

When the noise having the lower voltage than that of the low voltage source $V_{SS}$ is fed to the input terminal 66, as described above, the first diode 72 is forward-biased, and the noise current is by-passed to the low voltage source $V_{SS}$ via the first resistor 65 and the first diode 72 of the polycrystalline silicon diode 73, as indicated by an arrow B in FIG. 11.

In this embodiment, when the polycrystalline silicon 64 of the first resistor 65 is formed using the P+-type polycrystalline silicon and is integrally combined with the polycrystalline diode 77 of the third diode 76 in the similar way to the example shown in FIG. 9, the chip size can be largely reduced.

Figure 12:
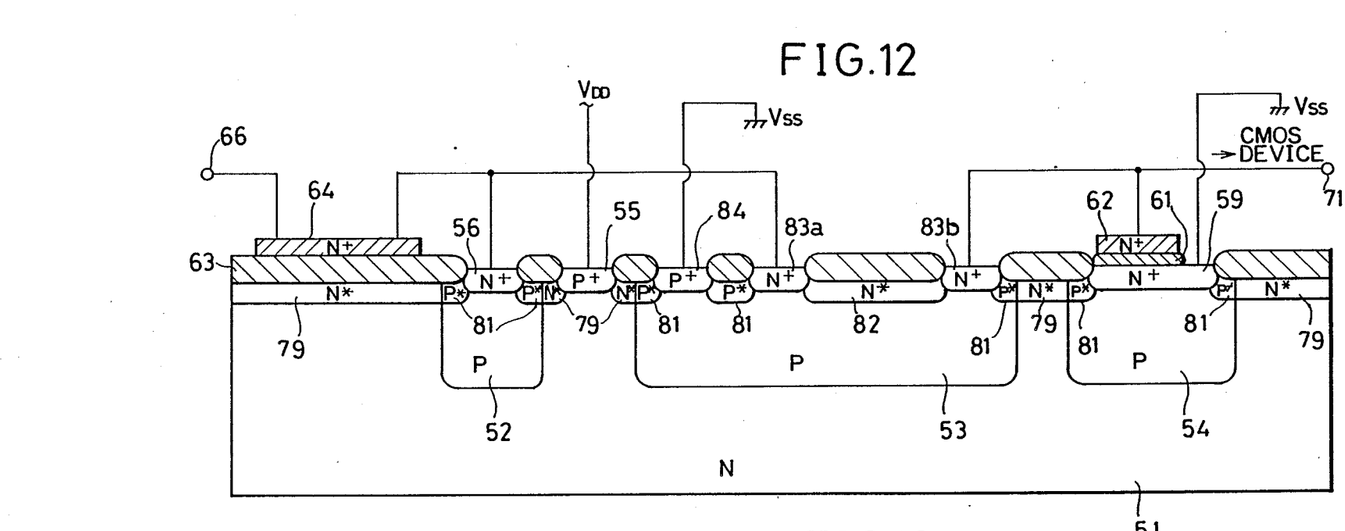
FIG. 12 is a longitudinal cross sectional view of a fourth embodiment of the input protector device according to the present invention.
Figure 13:
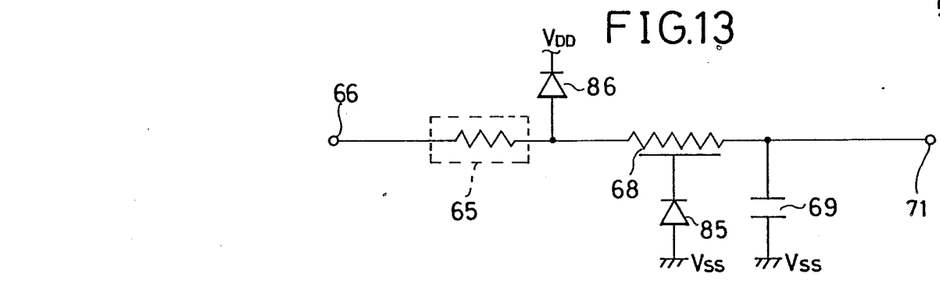
FIG. 13 is a circuit diagram of FIG. 12.

In FIGS. 12 and 13, there is shown fourth embodiment of the input protector device according to the present invention. In this embodiment, as in a usual CMOS device, N*-type channel stopper regions 76 of a high resistance impurity diffusion region are provided right under the silicon oxide film 63 in the surface areas of the N-type substrate 51 and P*-type channel stopper regions 81 of a high resistance impurity diffusion region are provided right under the silicon oxide film 63 in the surface areas of the first, second and third P-type well regions 52 to 54. In this embodiment, however, an N*-type channel stopper region 82 of the high resistance impurity diffusion area for constituting the second resistor 68 is formed under the silicon oxide film 63 in the surface area of the second P-type well region 53.

A pair of N+-type contact regions 83a and 83b are provided in the surface area of the second P-type well region 53 in contact with the left and right side ends of the N*-type channel stopper region 82, and a P+-type region 84 is formed in the left side end portion of the surface area of the second P-type well region 53. The N+-type contact regions 83a and 83b are connected to one end of the N+-type polycrystalline silicon 64 and the output terminal 71, respectively, and the P+-type region 84 is linked to the low voltage source $V_{SS}$. A first diode 85 is formed by the PN junction of the second P-type well region 53 and the N*-type channel stopper region 82, and a second diode 86 is formed by the PN junction of the first P-type well region 52 and the N-type substrate 51.

In the fourth embodiment, the same effects and advantages as those obtained in the above described embodiments can be resulted.

It is readily understood from the description of the preferred embodiments of the present invention that the noise current flowing the device is restricted by the resistor or is by-passed through another diode to effectively prevent the latchup, and a series of resistors are separately provided to reduce the pattern areas and the chip area, and that the resistors are formed on the oxide film on the substrate by using the high resistance diffusion area with a good accuracy of the resistance.

What is claimed is:

1. An input protector device for a semiconductor device, comprising:
   a semiconductor substrate of a first conductivity type, having an insulating film on a surface thereof;
   a first resistor formed on the insulating film and connected to an input terminal;
   a second resistor of an impurity diffusion region formed in the substrate and connected to an output, the first and second resistors being coupled in series between the input and output terminal;
   a capacitor formed in a surface area of the substrate and connected to the output terminal, the capacitor and the first and second resistors constituting a first device for by-passing high frequency noise;
   a first diode coupled to the connection point between the first and second resistors, the first diode and the first resistor constituting a second device for by-passing one of a low voltage noise and a high voltage noise; and
   a second diode formed in the substrate to integrally connect to the second resistor, the second diode and the first and second resistors constituting a third device for by-passing the other one of the low and high voltage noises.

2. The device of claim 1, also including a third diode connected to the connection point between the first and second resistors, the third diode and the first resistor constituting a forth device for by-passing the high voltage noise.

3. The device of claim 1, wherein the first resistor comprises polycrystalline silicon.

4. The device of claim 1, wherein the second resistor comprises a high resistance diffusion region of a second conductivity type opposite to the first conductivity type.

5. The device of claim 1, wherein the first diode comprises a PN junction between a P-type well region and an $N^+$-type region.

6. The device of claim 1, wherein the first diode comprises a polycrystalline silicon diode.

7. The device of claim 1, wherein the first diode comprises a PN junction between a P-type well region and N-type channel stopper region.

8. The device of claim 1, wherein the second diode comprises a PN junction of a P-type well region and N-type substrate.

9. The device of claim 2, wherein the third diode comprises a polycrystalline silicon diode.

10. The device of claim 1, wherein the first resistor and the first diode are integrally coupled to each other and comprise polycrystalline silicon.

11. The device of claim 1, wherein the capacitor comprises N-type diffusion region formed in the surface area of the substrate, a polycrystalline silicon film and an insulating film placed therebetween.

* * * * *